(12) United States Patent
Murakuki et al.

(10) Patent No.: US 8,446,751 B2
(45) Date of Patent: May 21, 2013

(54) SEMICONDUCTOR MEMORY DEVICE

(75) Inventors: Yasuo Murakuki, Kyoto (JP); Shunichi Iwanari, Kyoto (JP); Yoshiaki Nakao, Osaka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 13/170,645

(22) Filed: Jun. 28, 2011

(65) Prior Publication Data

US 2011/0255328 A1 Oct. 20, 2011

Related U.S. Application Data

(63) Continuation of application No. PCT/JP2010/006148, filed on Oct. 15, 2010.

(30) Foreign Application Priority Data

Nov. 9, 2009 (JP) .................................. 2009-255991

(51) Int. Cl.
| | | |
|---|---|---|
| *G11C 5/02* | (2006.01) | |
| *G11C 5/06* | (2006.01) | |
| *G11C 5/10* | (2006.01) | |
| *G11C 7/02* | (2006.01) | |
| *G11C 11/22* | (2006.01) | |
| *G11C 11/24* | (2006.01) | |

(52) U.S. Cl.
USPC ............... 365/65; 365/145; 365/149; 365/51; 365/63; 365/72; 365/206

(58) Field of Classification Search
USPC .................. 365/149, 145, 51, 63, 72, 65, 206
See application file for complete search history.

(56) References Cited

U.S. PATENT DOCUMENTS

| | | | | |
|---|---|---|---|---|
| 5,430,671 | A | * | 7/1995 | Hirano et al. .................. 365/145 |
| 5,519,243 | A | | 5/1996 | Kikuda et al. |
| 5,801,412 | A | * | 9/1998 | Tobita ........................... 257/296 |
| 6,118,688 | A | * | 9/2000 | Hirano et al. .................. 365/145 |
| 6,205,064 | B1 | | 3/2001 | Ooishi |
| 6,337,824 | B1 | * | 1/2002 | Kono et al. .................... 365/207 |
| 2001/0014040 | A1 | | 8/2001 | Ooishi |
| 2004/0061144 | A1 | | 4/2004 | Sato et al. |
| 2006/0161744 | A1 | * | 7/2006 | Fukuda ......................... 711/154 |
| 2009/0097301 | A1 | | 4/2009 | Takahashi et al. |
| 2010/0109063 | A1 | * | 5/2010 | Hayashida ..................... 257/300 |

FOREIGN PATENT DOCUMENTS

| | | |
|---|---|---|
| JP | 7-086430 | 3/1995 |
| JP | 2000-268596 | 9/2000 |
| JP | 2003-332532 | 11/2003 |
| JP | 2004-119937 | 4/2004 |
| JP | 2008-010765 | 1/2008 |
| WO | WO 2006/129488 A1 | 12/2006 |

\* cited by examiner

*Primary Examiner* — Jung H. Hur
(74) *Attorney, Agent, or Firm* — McDermott Will & Emery LLP

(57) ABSTRACT

The demand for reducing the size and increasing the degree of integration of semiconductor memory devices has increased. In a semiconductor memory device, a smoothing capacitor which has to be provided therein for stabilizing a power supply voltage etc. is formed in an underlying layer of memory cells A and B to overlap the two memory cells A and B which are adjacent each other. Thus, an area occupied by the smoothing capacitor having a large capacity can be reduced to increase the degree of integration, and the smoothing capacitor having a large capacity can be provided in the semiconductor memory device.

20 Claims, 11 Drawing Sheets

SEMICONDUCTOR MEMORY DEVICE

CROSS-REFERENCE TO RELATED APPLICATION

This is a continuation of PCT International Application PCT/JP2010/006148 filed on Oct. 15, 2010, which claims priority to Japanese Patent Application No. 2009-255991 filed on Nov. 9, 2009. The disclosures of these applications including the specifications, the drawings, and the claims are hereby incorporated by reference in their entirety.

BACKGROUND

The present disclosure relates to a semiconductor memory and a memory system, and more particularly to a semiconductor memory device including a ferroelectric random access memory (FeRAM).

Ferroelectric memory is a type of memory in which polarization inversion is used to retain information in a ferroelectric capacitor, and is a non-volatile memory in which the retained data is not lost even while power is not supplied thereto.

In a semiconductor memory device, in addition to a memory region, a peripheral circuit region is provided. Various circuits such as a logic circuit and a power supply circuit, and an A/D converter, each being made of a CMOS transistor, are provided in the peripheral circuit region. For example, smoothing capacitors are provided in the semiconductor memory device for the purpose of stabilizing power supply voltages to such circuits, etc. In a fabrication process for providing a memory in a semiconductor memory device, the smoothing capacitors are formed simultaneously with the formation of memory capacitors of memory cells, using the same material for both capacitors. For example, in Japanese Patent Publication No. 2008-10765 and Japanese Patent Publication No. 2003-332532, memory capacitors of dummy memory cells which do not function as memories are caused to be function as smoothing capacitors.

SUMMARY

However, the demand for reducing the size and increasing the degree of integration of semiconductor memory devices has increased, and an area occupied by smoothing capacitors which have to be provided for stabilizing the power supply voltage etc. has become not negligible. This is a problem in increasing the degree of integration.

In a FeRAM memory device, which is a non-volatile memory, very large smoothing capacitors are necessary in order to protect data while power is not supplied thereto and, for example, to complete write and read operations with a voltage equal to or higher than a predetermined voltage, etc. Consequently, the area occupied by such smoothing capacitors is increased.

To solve the above-described problems, a semiconductor memory device according to a first aspect of the present disclosure includes: a plurality of bit lines arranged in a column direction; a plurality of word lines arranged in a row direction; and a memory cell array including a plurality of memory cells which are arranged at intersections of the bit lines and the word lines, each memory cell including a selective element and a first capacitive element connected in series between an associated one of the bit lines and the plate interconnect, the selective element having a control terminal connected to an associated one of the word lines, and, in an underlying layer of the first capacitive element, a second capacitive element is provided to overlap two or more of the memory cells.

According to a second aspect of the present disclosure, in the semiconductor memory device of the first aspect, respective lengths of short sides and long sides of an electrode of the first capacitive element connected to the selective element are different from each other.

According to a third aspect of the present disclosure, the semiconductor memory device of the first aspect further includes: a dummy memory cell array which is not used as a memory element and provided near the memory cell array, and a bit line of the dummy memory cell array and a terminal of the second capacitive element are connected together.

According to a forth aspect of the present disclosure, the semiconductor memory device of the first aspect, in the selective element is a first MOS transistor, and the second capacitive element is a second MOS transistor.

According to a fifth aspect of the present disclosure, in the semiconductor memory device of the fourth aspect, a thickness of a gate oxide film of the first MOS transistor is different from a thickness of a gate oxide film of the second MOS transistor.

According to a sixth aspect of the present disclosure, in the semiconductor memory device of the fourth aspect, a direction in which a source and a drain of the first MOS transistor are arranged is different from a direction in which a source and a drain of the second MOS transistor are arranged.

According to a seventh aspect of the present disclosure, in the semiconductor memory device of the fourth aspect, the first and second MOS transistors are NMOS transistors.

According to an eighth aspect of the present disclosure, in the semiconductor memory device of the fourth aspect, the control terminal of the first MOS transistor is a gate electrode.

According to a ninth aspect of the present disclosure, in the semiconductor memory device of the first aspect, a voltage of the first terminal of the second capacitive element is a power supply voltage, and a voltage of the second terminal of the second capacitive element is ground potential.

According to a tenth aspect of the present disclosure, in the semiconductor memory device of the first aspect, a voltage of the first terminal of the second capacitive element is a power supply voltage for driving an associated one of the word lines, and a voltage of the second terminal of the second capacitive element is ground potential.

According to an eleventh aspect of the present disclosure, in the semiconductor memory device of the first aspect, a voltage of the first terminal of the second capacitive element is a power supply voltage of an internal power supply circuit provided in a peripheral circuit section, and a voltage of the second terminal of the second capacitive element is ground potential.

According to a twelfth aspect of the present disclosure, in the semiconductor memory device of the first aspect, the first capacitive element is a ferroelectric capacitor.

According to a thirteenth aspect of the present disclosure, in the semiconductor memory device of the first aspect, the plurality of bit lines are arranged below the first capacitive elements.

According to a fourteenth aspect of the present disclosure, in the semiconductor memory device of the first aspect, the plurality of bit lines are arranged above the first capacitive elements.

According to a fifteenth aspect of the present disclosure, in the semiconductor memory device of the first aspect, the plurality of memory cells include a first memory cell and a second memory cell, the selective element of the first memory cell includes a first doped region to which the first capacitive element of the first memory cell is connected and a second doped region connected to an associated one of the bit lines, the selective element of the second memory cell includes a third doped region to which the first capacitive element of the second memory cell is connected, and a fourth doped region connected to an associated one of the bit lines, a gate electrode of the selective element of the first memory cell and a gate electrode of the selective element of the second memory cell are connected to different word lines, and the second capacitive element is arranged between the first doped region and the third doped region.

Based one the foregoing, according to the first aspect, the second capacitive element is provided to overlap the plurality of the memory cells. Thus, the second capacitive element serving as a smoothing capacitor having a large capacity can be provided. Also, multiple ones of the second capacitive element can be arranged in a memory cell array, and thus, a very large smoothing capacitor can be provided without increasing an area.

In the semiconductor memory device of the second aspect, the respective lengths of the short sides and the long sides of the electrode of the first capacitive element connected to the selective element are changed, and thus, an interval between adjacent two of the word lines can be increased while the memory characteristics (e.g., a retained charge amount) of the first capacitive element and the memory cell area. Therefore, the capacity of the second capacitive element can be increased, so that a smoothing capacitor with a larger capacity can be provided.

Furthermore, in the semiconductor memory device of the third aspect, when a dummy memory cell which is not used as a memory element is provided near a memory cell array, a bit line of the dummy memory cell array and a terminal of the second capacitive element are connected together. Thus, connection of the terminal of the second capacitor can be provided without increasing an area.

In addition, in the semiconductor memory device of the fourth aspect, the second capacitive element is a MOS transistor. Thus, the second capacitor can be provided without adding any process step.

In the semiconductor memory device of the fifth aspect, the selective element and the second capacitive element are MOS transistors having different gate oxide film thicknesses. As the selective element, a MOS transistor whose breakdown voltage of (power supply voltage+MOS threshold voltage) or more is used so that the power supply voltage can be applied to the first capacitive element. On the other hand, the second capacitive element is used as a smoothing capacitor, and thus, as long as a breakdown voltage which is substantially equal to the power supply voltage is ensured for the second capacitive element, there is no problem. Therefore, the second capacitive element (a smoothing capacitor) can be comprised of a MOS transistor in which the thickness of the gate oxide film of the second capacitive element can be reduced to a thickness with which a breakdown voltage which is substantially equal to the power supply voltage is ensured, so that the smoothing capacitor with a larger capacity can be provided in the semiconductor memory device.

Furthermore, in the semiconductor memory device of the sixth aspect, a direction in which a source and a drain of the first MOS transistor are arranged is different from a direction in which a source and a drain of the second MOS transistor are arranged. Thus, the areas of the source and drain of the second capacitive element serving as the second MOS transistor can be reduced, so that the smoothing capacitor with a larger capacity can be provided in the semiconductor memory device.

As described above, in a semiconductor memory device according to any one of the first through fifteenth aspects, a large smoothing capacitor with a large capacity can be arranged in a memory cell array. Thus, a smoothing capacitor which is necessary for stabilizing a power supply voltage can be provided in the semiconductor memory device without increasing an area.

DETAILED DESCRIPTION

First Embodiment

Figure 11:
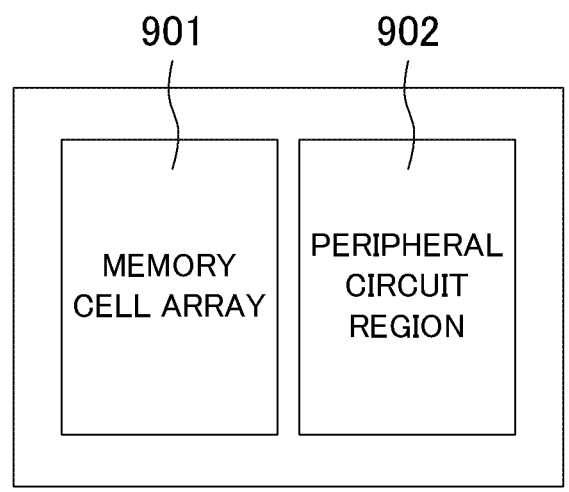
FIG. 11 is a view schematically illustrating an overall configuration of the semiconductor memory device of the first embodiment.

FIG. 11 is a view schematically illustrating an overall configuration of a semiconductor memory device according to an embodiment of the present disclosure. In FIG. 11, 901 is a memory cell array, and 902 is a peripheral circuit region.

Figure 1:
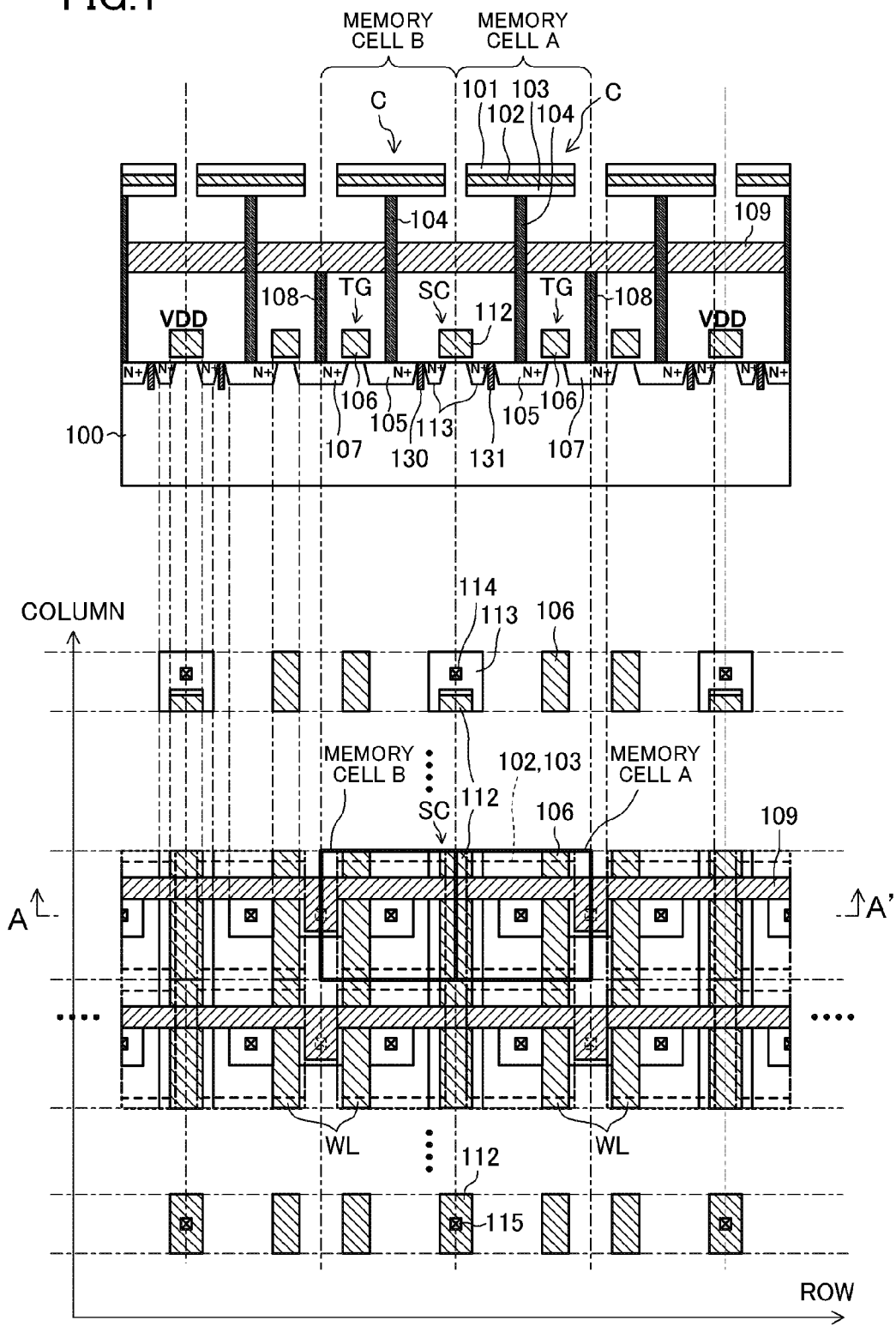
FIG. 1 shows a cross-sectional view and a plan view of a memory cell array of a semiconductor memory device according to a first embodiment of the present disclosure. The cross-sectional view illustrates a cross-section taken along the line A-A' of the plan view.

FIG. 1 shows a cross-sectional view and a plan view of a memory cell array of a semiconductor memory device according to a first embodiment of the present disclosure, which has the features of claims 1, 4, and 7 of the present application. The cross-sectional view illustrates a cross-section taken along the line A-A of the plan view. The plan view illustrates a part of the memory cell array 901, including memory cells arranged in four rows and two columns. A configuration of each memory cell will be described below with reference to the cross-sectional view taken along the line A-A' and the plan view.

In FIG. 1, 100 denotes a substrate, 109 denotes bit lines extending in a row direction, and WL denotes word lines extending in a column direction. Memory cells are arranged at intersections of the bit lines 109 and the word lines WL. First and second memory cells A and B, which are adjacent to each other in the row direction, will be described below.

The memory cell A includes a ferroelectric memory capacitive element C as a first capacitive element, and a transfer gate TG as a selective element.

In the ferroelectric memory capacitive element C of the memory cell A, 101 is a plate interconnect (an upper electrode), 102 is a ferroelectric, and 103 is a lower electrode. The transfer gate TG is comprised of a first NMOS transistor, 105 and 107 are doped regions of the transfer gate TG, and 106 is a gate electrode. One of the doped regions, i.e., a first doped region 105 of the transfer gate TG is connected to the lower electrode 103 of the ferroelectric memory capacitive element C via a lower electrode contact 104, the other one of the doped regions, i.e., a second doped region 107 of the transfer gate TG is connected to a bit line 109 via a bit line contact 108, and the ferroelectric memory capacitive element C and the transfer gate TG are connected in series between the bit line 109 and the plate interconnect (the upper electrode). A gate electrode (control terminal) 106 of the transfer gate TG is connected to an associated one of the word lines WL.

The memory cell B which is adjacent to the memory cell A has a similar configuration to the configuration of the memory cell A. The memory cell B includes a ferroelectric memory capacitive element C which is a first capacitive element, and a transfer gate TG which is a selective element. The word line WL connected to the gate electrode 106 of the transfer gate TG of the memory cell B is a different one from the word line WL connected to the gate electrode 106 of the transfer gate TG of the memory cell A. Each member of the memory cell B also provided in the memory cell A is identified by the same reference character, and the detail description of the memory cell B will be omitted.

A smoothing capacitor SC as a second capacitive element is arranged in an underlying layer of a plurality of the ferroelectric memory capacitive elements C of memory cells which include the two memory cells A and B to overlap the ferroelectric memory capacitive elements in the column direction. Specifically, the smoothing capacitor SC is arranged in a region of the underlying layer to extend in the column direction between a doped region (the first doped region) 105 of the transfer gate TG of the memory cell A connected to the ferroelectric memory capacitive element C of the memory cell A, and a doped region (a third doped region) 105 of the transfer gate TG of the memory cell B adjacent to the memory cell A, which is connected to the ferroelectric memory capacitive element C of the memory cell B.

The smoothing capacitor SC is comprised of a second NMOS transistor, and includes a gate electrode 112 and doped regions 113 which extend in the column direction. The gate electrode 112 and the doped regions 113 form a MOS transistor capacitor. In the smoothing capacitor SC, a contact 114 is provided at one end portion of the memory cell array 901 to couple the doped regions 113 of the smoothing capacitor SC to ground potential, and a contact 115 is provided at the other end portion of the memory cell array 901 to couple the gate electrode 112 of the smoothing capacitor SC to power supply potential. Note that in FIGS. 1, 130 and 131 denote isolation regions.

As described above, the common gate electrode 112 connected to a power supply source is arranged to overlap the plurality of memory cells including the two memory cells A and B, and the doped regions 113 as a source and a drain are arranged in the row direction, so that the smoothing capacitor SC can be arranged in a region of the ferroelectric memory capacitive elements C.

Second Embodiment

Figure 2:
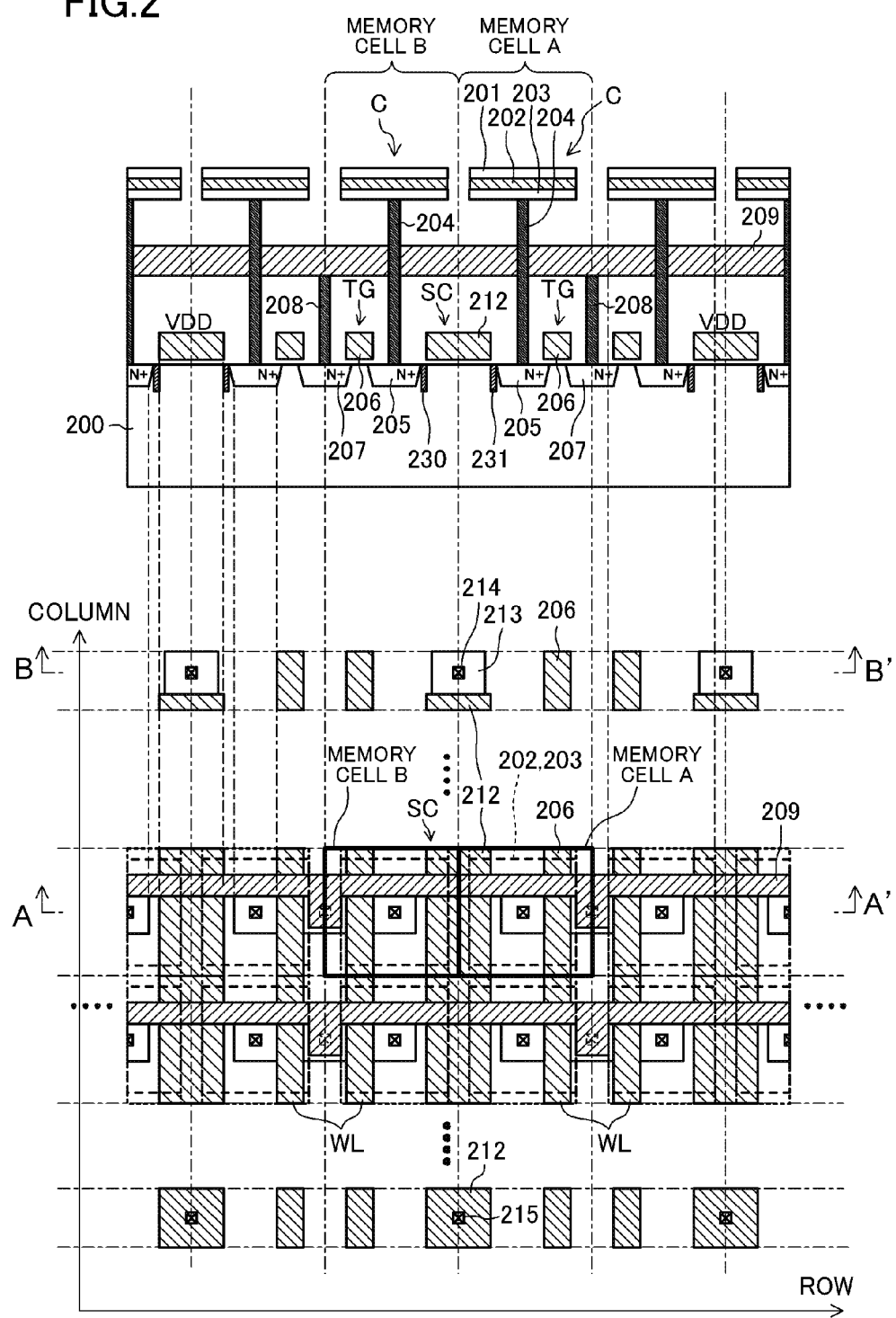
FIG. 2 shows a cross-sectional view and a plan view of a memory cell array of a semiconductor memory device according to a second embodiment of the present disclosure. The cross-sectional view illustrates a cross section taken along the line A-A' of the plan view.

FIG. 2 shows a cross-sectional view and a plan view of a memory cell array of a semiconductor memory device according to a second embodiment of the present disclosure, which has the features of claims 1, 4, 6 and 7 of the present application. The cross-sectional view illustrates a cross section taken along the line A-A' of the plan view. The plan view illustrates a part of the memory cell array 901, including memory cells arranged in four rows and two columns. A configuration of the plurality of memory cells will be described below with reference to a memory cell A of the cross-sectional view taken along the line A-A'.

In FIG. 2, 200 is a substrate. In a ferroelectric memory capacitive element C which is a first capacitive element, 201 is a plate interconnect (an upper electrode), 202 is a ferroelectric, 203 is a lower electrode, and 204 is a lower electrode contact connected to a doped region 205 of a transfer gate TG.

The transfer gate TG, which is a selective element, is comprised of a first NMOS transistor, 205 and 207 are doped regions of the transfer gate TG, and 206 is a gate electrode connected to a word line WL. Furthermore, 208 is a bit line contact, 209 is a bit line, and the doped region 207 and the bit line 209 are connected together by the bit line contact 208.

The smoothing capacitor SC is comprised of a second NMOS transistor, and a gate electrode 212 and doped regions 213 form a MOS transistor capacitor. Note that 230 and 231 are isolation regions. A contact 214 is provided at one end portion of the memory cell array 901 to couple the doped region 213 of the smoothing capacitor SC to ground potential, and a contact 215 couples the gate electrode 212 of the smoothing capacitor SC to power supply source.

Figure 3:
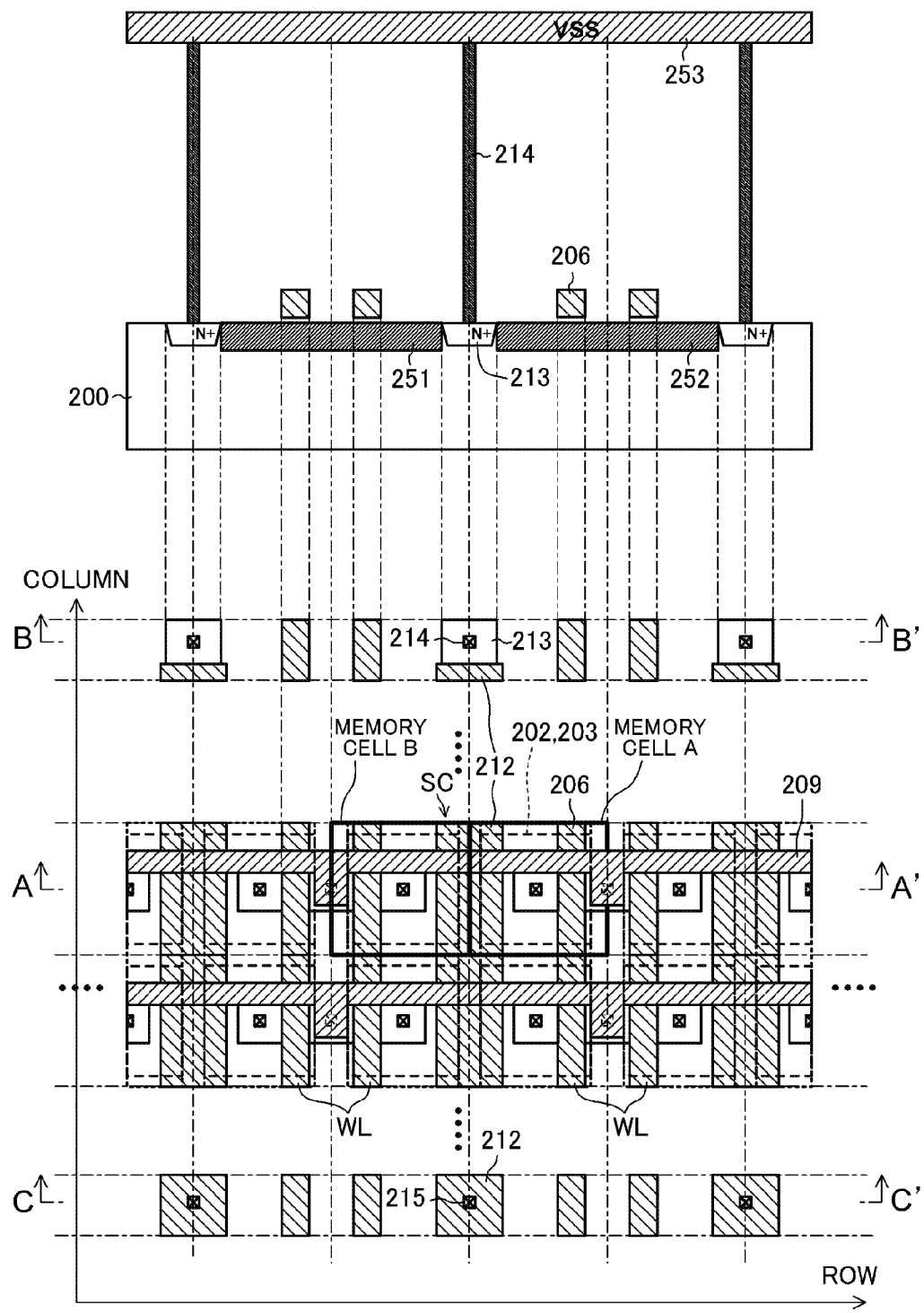
FIG. 3 shows a cross-sectional view and a plan view of the memory cell array of the semiconductor memory device of the second embodiment. The cross-sectional view illustrates a cross section taken along the line B-B' of the plan view.

FIG. 3 shows a cross-sectional view and a plan view of the memory cell array, and the cross-sectional view illustrates a cross section taken along the line B-B' of the plan view. In FIGS. 3, 251 and 254 are isolation regions, and 253 is an interconnect connected to the ground potential. The doped region 213 is connected to the ground potential via the contact 214.

Figure 4:
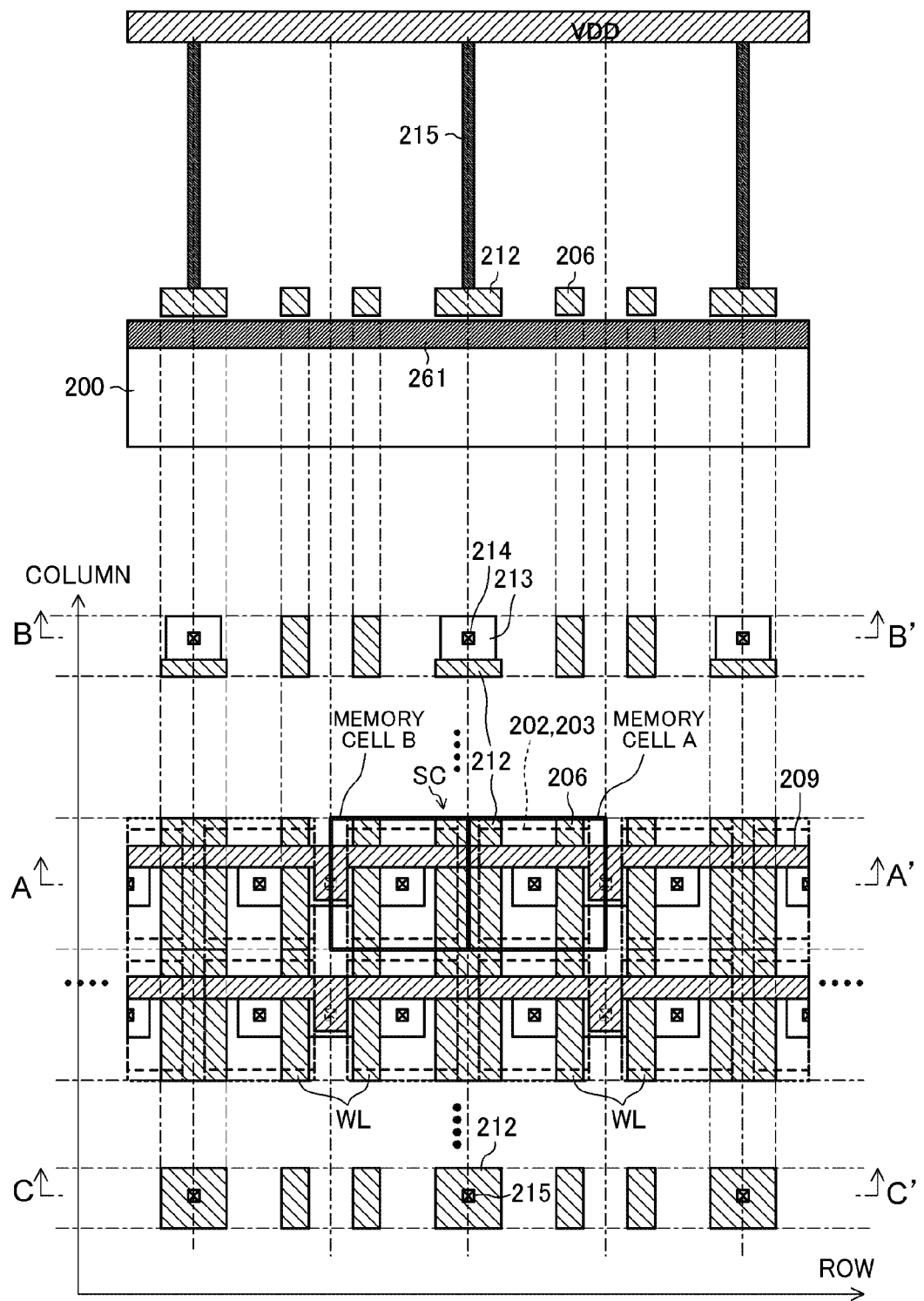
FIG. 4 shows a cross-sectional view and a plan view of the memory cell array of the semiconductor memory device of the second embodiment. The cross-sectional view illustrates a cross-section taken along the line C-C' of the plan view.

FIG. 4 shows a cross-sectional view and a plan view of the memory cell array, and the cross-sectional view illustrates a cross section taken along the line C-C' of the plan view. In FIG. 4, 261 is an isolation region, and 263 is an interconnect connected to the power supply potential VDD. The gate electrode 212 is connected to the power supply potential of the interconnect 263 via the contact 215.

As described above, the common gate electrode 212 connected to a power supply source is arranged to overlap the memory cells A and B, and the doped regions 213 as a source and a drain are arranged in the column direction, so that the smoothing capacitor SC having a larger capacity than that of the first embodiment can be arranged in a region of the ferroelectric memory capacitive elements C.

Third Embodiment

Figure 5:
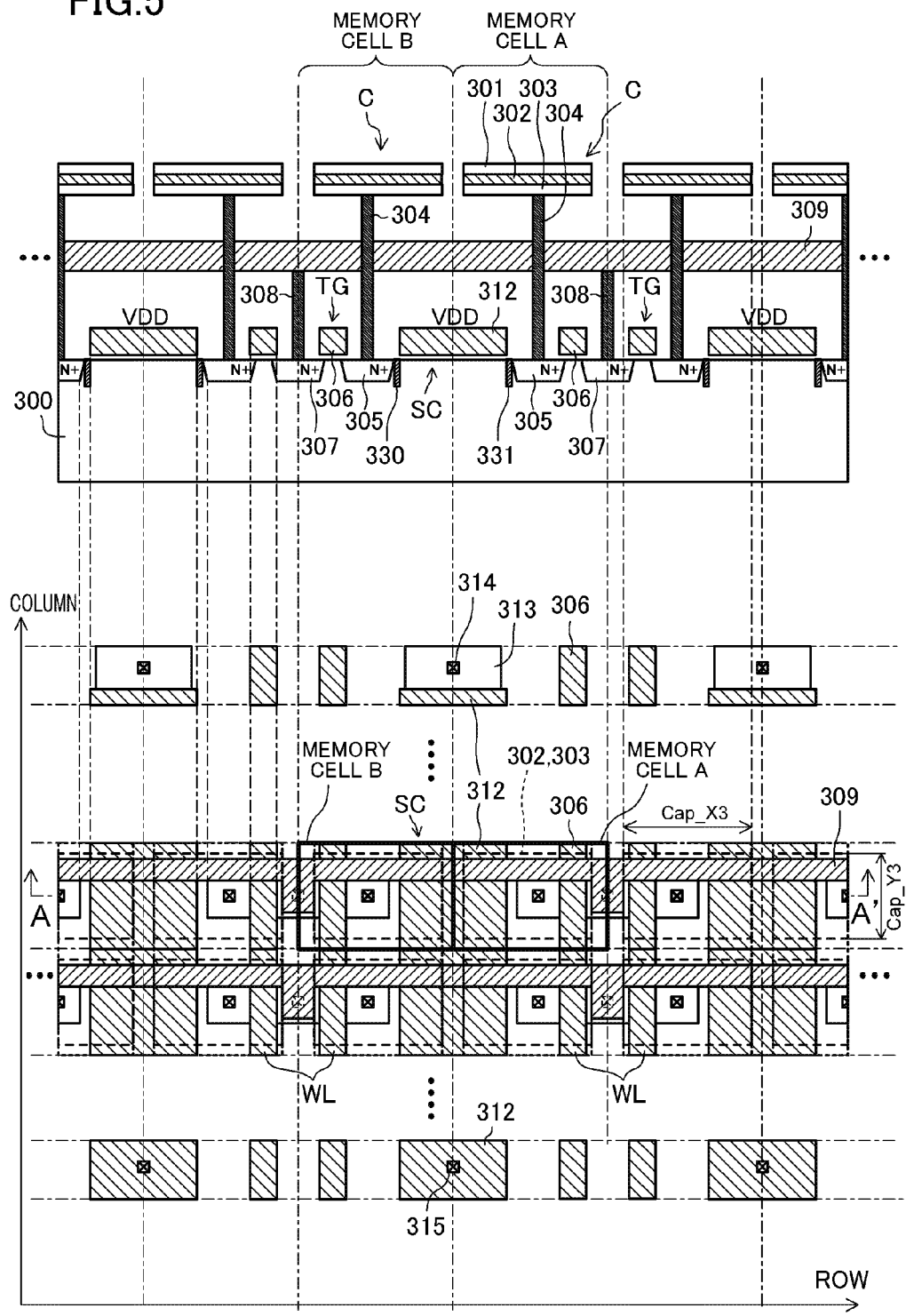
FIG. 5 shows a cross-sectional view and a plan view of a memory cell array of a semiconductor memory device according to a third embodiment of the present disclosure. The cross-sectional view illustrates a cross-section taken along the line A-A' of the plan view.

FIG. 5 shows a cross-sectional view and a plan view of a memory cell array of a semiconductor memory device according to a third embodiment of the present disclosure having the features of claims 1, 2, 4, 6, and 7 of the present application. The cross-sectional view illustrates a cross section taken along the line A-A' of the plan view. The plan view illustrates a part of the memory cell array 901, including memory cells arranged in four rows and two columns. A configuration of plurality of memory cells will be described below with reference to a memory cell A of the cross-sectional view taken along the line A-A'.

In FIG. 5, 300 is a substrate. In a ferroelectric memory capacitive element C which is a first capacitive element, 301 is a plate interconnect (an upper electrode), 302 is a ferroelectric, 303 is a lower electrode, and 304 is a lower electrode contact connected to a doped region 305 of the transfer gate TG.

A transfer gate TG, which is a selective element, is comprised of a first NMOS transistor, 305 and 307 are doped regions of the transfer gate TG, and 306 is a gate electrode of the transfer gate TG connected to a word line WL. Furthermore, 308 is a bit contact, 309 is a bit line, and the doped region 307 and the bit line 309 are connected by the bit line contact 308.

A smoothing capacitor SC is comprised of a second NMOS transistor, and includes a gate electrode 312 and doped regions 313. The gate electrode 312 and the doped regions 313 form a MOS transistor capacitor. Note that 330 and 331 are isolation regions. A contact 314 is provided at one end portion of the memory cell array 901 to couple the doped region 313 of the smoothing capacitor SC to ground potential, and a contact 315 couples the gate electrode 312 to power supply potential.

In FIG. 5, Cap_X3 and Cap_Y3 indicate dimensions of the lower electrode 303 of a ferroelectric memory capacitive element C in a row direction and a column direction. The area of the ferroelectric memory capacitive element C is represented by the product of the Cap_X3 and the Cap_Y3, and is set to satisfy memory characteristics. In this case, an interval between the doped regions 305 to which the lower electrodes 304 of the memory cells A and B are connected can be increased by setting Cap_X3 and a Cap_Y3 so that Cap_X3>Cap Y is achieved.

As described above, the common gate electrode 312 connected to a power supply source is arranged to overlap the two memory cells A and B, the doped regions 313 as a source and a drain are arranged in the column direction, and the lower electrode 303 of the ferroelectric memory capacitive element C is formed to have a rectangular shape, so that the smoothing capacitor SC having a larger capacity than that of the second embodiment can be arranged in a region of the ferroelectric memory capacitive elements C.

Fourth Embodiment

Figure 6:
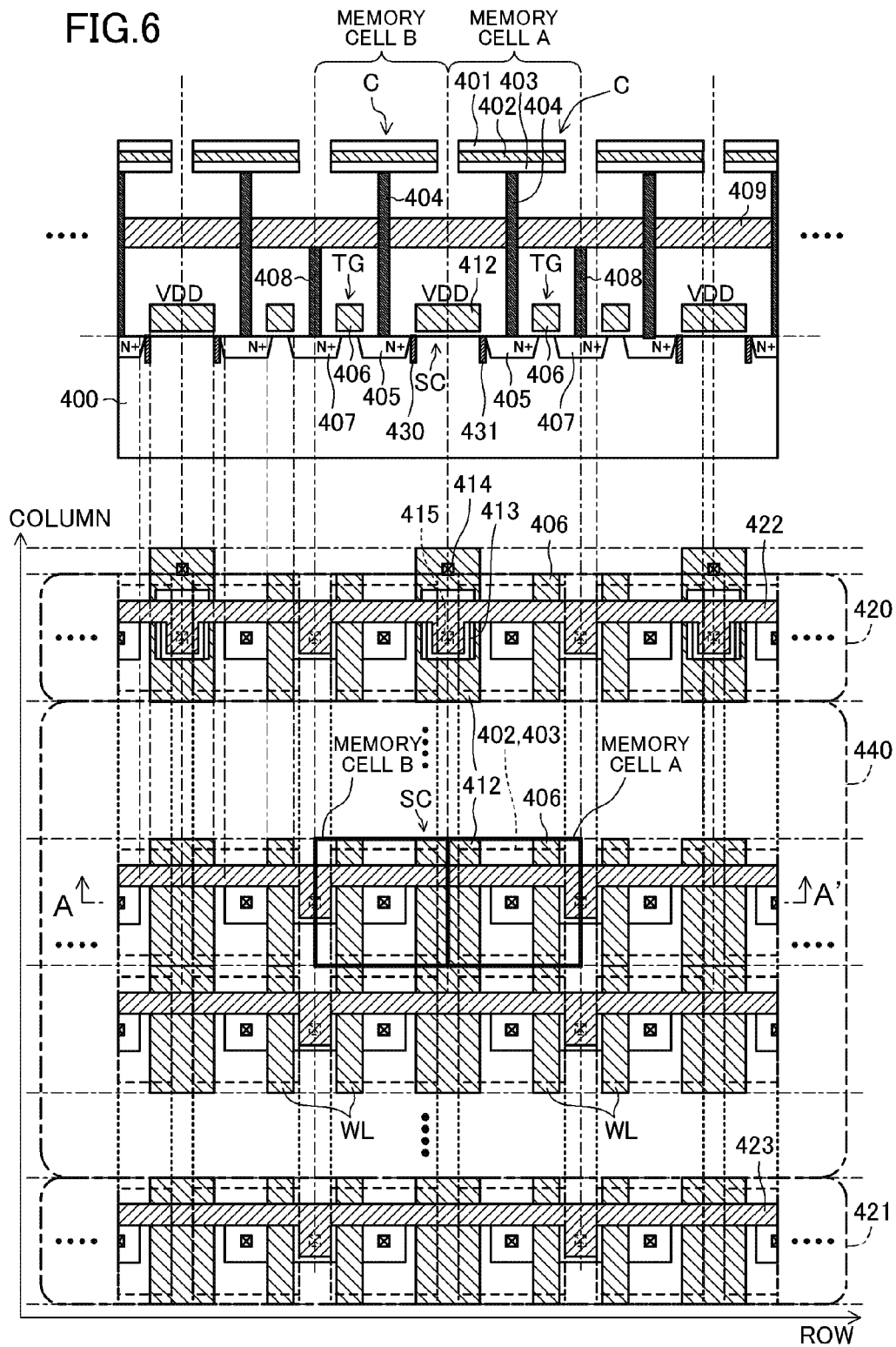
FIG. 6 shows a cross-sectional view and a plan view of a memory cell array of a semiconductor memory device according to a fourth embodiment of the present disclosure. The cross-sectional view illustrates a cross-section taken along the line A-A' of the plan view.

FIG. 6 shows a cross-sectional view and a plan view of a semiconductor memory device according to a fourth embodiment of the present disclosure having the features of claims 1, 2, 3, 4, 6, and 7 of the present application. The cross-sectional view illustrates a cross-section taken along the line A-A' of the plan view. The plan view illustrates a part of the memory cell array 901, i.e., a memory cell array 440 and dummy memory cell arrays 420 and 421, each including memory cells arranged in four rows and two columns. This embodiment shows a case where, when dummy memory arrays have to be provided near a memory cell array, the present disclosure is applied.

A configuration of a plurality of memory cells will be described below with reference to a memory cell A of the cross-sectional view taken along the line A-A'. In FIG. 6, 400 is a substrate. In a ferroelectric memory capacitive element C which is a first capacitive element, 401 is a plate interconnect (an upper electrode), 402 is a ferroelectric, 403 is a lower electrode, and 404 is a lower electrode contact connected to a doped region 405 of a transfer gate TG.

The transfer gate TG, which is a selective element, is comprised of a first NMOS transistor, 405 and 407 are doped regions of the transfer gate TG, and 406 is a gate electrode connected to a word line WL. Furthermore, 408 is a bit line contact, 409 is a bit line, and the doped region 407 and the bit line 409 are connected by the bit line contact 408.

A smoothing capacitor SC includes a gate electrode 412 and doped regions 413, and the gate electrode 412 and the doped regions 413 form a MOS transistor capacitor. Note that 430 and 431 are isolation regions.

Furthermore, 420 and 421 are dummy memory cell arrays, 422 and 423 are dummy bit lines, and the potential thereof is ground potential. A contact 415 is provided in the dummy memory cell array 420 to couple the doped region 413 of the smoothing capacitor SC to the dummy bit line 422, thereby setting the potential equal to the ground potential. A contact 414 is provided at an end portion of the dummy memory cell array 420 to couple the gate electrode 412 of the smoothing capacitor SC to the power supply potential VDD for driving the word line WL. Note that the power supply potential VDD may be a power supply voltage of an internal power supply source circuit provided in a peripheral circuit section (not shown) provided in the peripheral circuit region 902 shown in FIG. 11.

As described above, the common gate electrode 412 connected to the power supply source is arranged to overlap the two memory cells A and B, the doped regions 413 as a source and a drain are arranged in the column direction to form a smoothing capacitor SC, and connection of the potential of the doped region 413 of the smoothing capacitor SC is provided using the dummy bit line 422 of the dummy memory cell array 420. Thus, connection of the doped regions 413 of the smoothing capacitor SC is provided in the dummy memory cell array 420, so that a space in which a contact of the doped region 413 of the smoothing capacitor SC is arranged can be eliminated, and the area of the memory cell array 901 can be further reduced.

Fifth Embodiment

Figure 7:
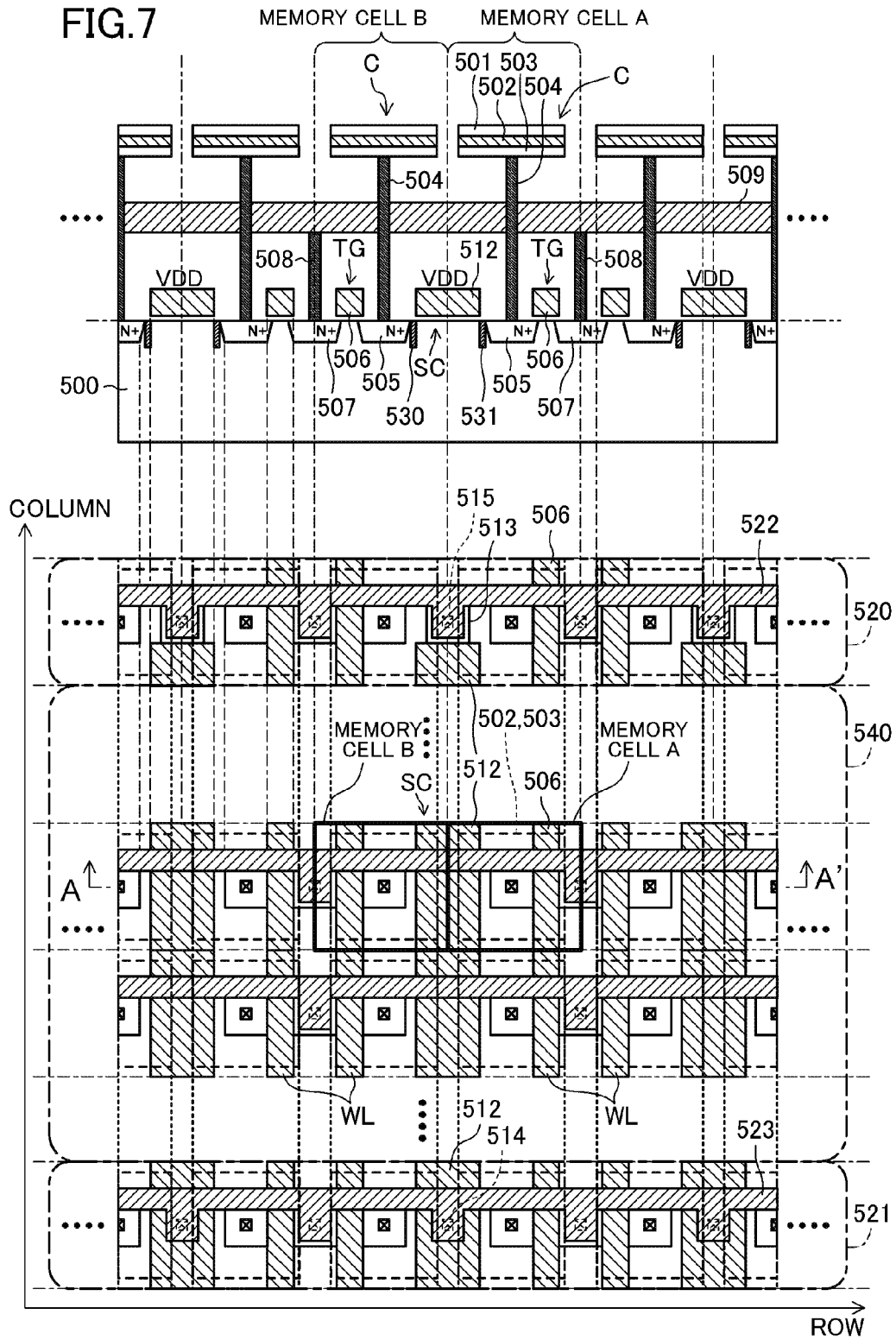
FIG. 7 shows a cross-sectional view and a plan view of a memory cell array of a semiconductor memory device according to a fifth embodiment of the present disclosure. The cross-sectional view illustrates a cross-section taken along the line A-A' of the plan view.

FIG. 7 shows a cross-sectional view and a plan view of a semiconductor memory device according to a fifth embodiment of the present disclosure having the features of claims 1, 2, 3, 4, 6, and 7 of the present application. The cross-sectional view illustrates a cross section taken along the line A-A' of the plan view. The plan view illustrates a part of the memory cell array 901, i.e., a memory cell array 540 and dummy memory cell arrays 520 and 521, each including memory cells arranged in four rows and two columns. This embodiment shows a case where, when dummy memory arrays have to be provided near a memory cell array, the present disclosure is applied.

A configuration of a plurality of memory cells will be described with reference to a memory cell A of the cross-sectional view taken along the line A-A'. In FIG. 7, 500 is a substrate. In a ferroelectric memory capacitive element C which is a first capacitive element, 501 is a plate interconnect (an upper electrode), 502 is a ferroelectric, 503 is a lower electrode, and 504 is a lower electrode contact connected to a doped region 505 of a transfer gate TG.

The transfer gate TG, which is a selective element, is comprised of a first NMOS transistor, 505 and 507 are doped regions of the transfer gate TG, and 506 is a gate electrode connected to a word line WL. Furthermore, 508 is a bit line contact, 509 is a bit line, and the doped region 507 and the bit line 509 are connected by the bit line contact 508.

A smoothing capacitor SC is comprised of a second NMOS transistor and includes a gate electrode (a first terminal) 512 and doped regions (second terminals) 513. The gate electrode 512 and the doped regions 513 form a MOS transistor capacitor. Note that 530 and 531 are isolation regions.

Furthermore, 520 and 521 are dummy memory cell arrays, 522 is a dummy bit line, and the potential thereof is ground potential.

A contact 515 is provided in the dummy memory cell array 520, and the doped region 513 of the smoothing capacitor SC is connected to the ground potential via the dummy bit line 522. A contact 514 is provided in the dummy memory cell array 521 to couple the gate electrode 512 of the smoothing capacitor SC to the power supply potential via a dummy bit line 523.

As described above, the common gate electrode 512 connected to the power supply source is arranged to overlap the memory cell A and the memory cell B, and the doped regions 513 as a source and a drain are arranged in the column direction to form a smoothing capacitor SC. The doped region 513 of the smoothing capacitor SC is connected to the ground potential using the dummy bit line 522 of the dummy memory cell array 520, and the gate electrode 512 of the smoothing capacitor SC is connected to the power supply potential using the dummy bit line 523 of the dummy memory cell 521. Thus, terminals of the smoothing capacitor SC are connected in dummy memory cell array sections, so that a space which is conventionally used for connection of the terminal can be reduced, and the area of the memory cell arrays can be further reduced, as compared to the fourth embodiment.

Sixth Embodiment

Figure 8:
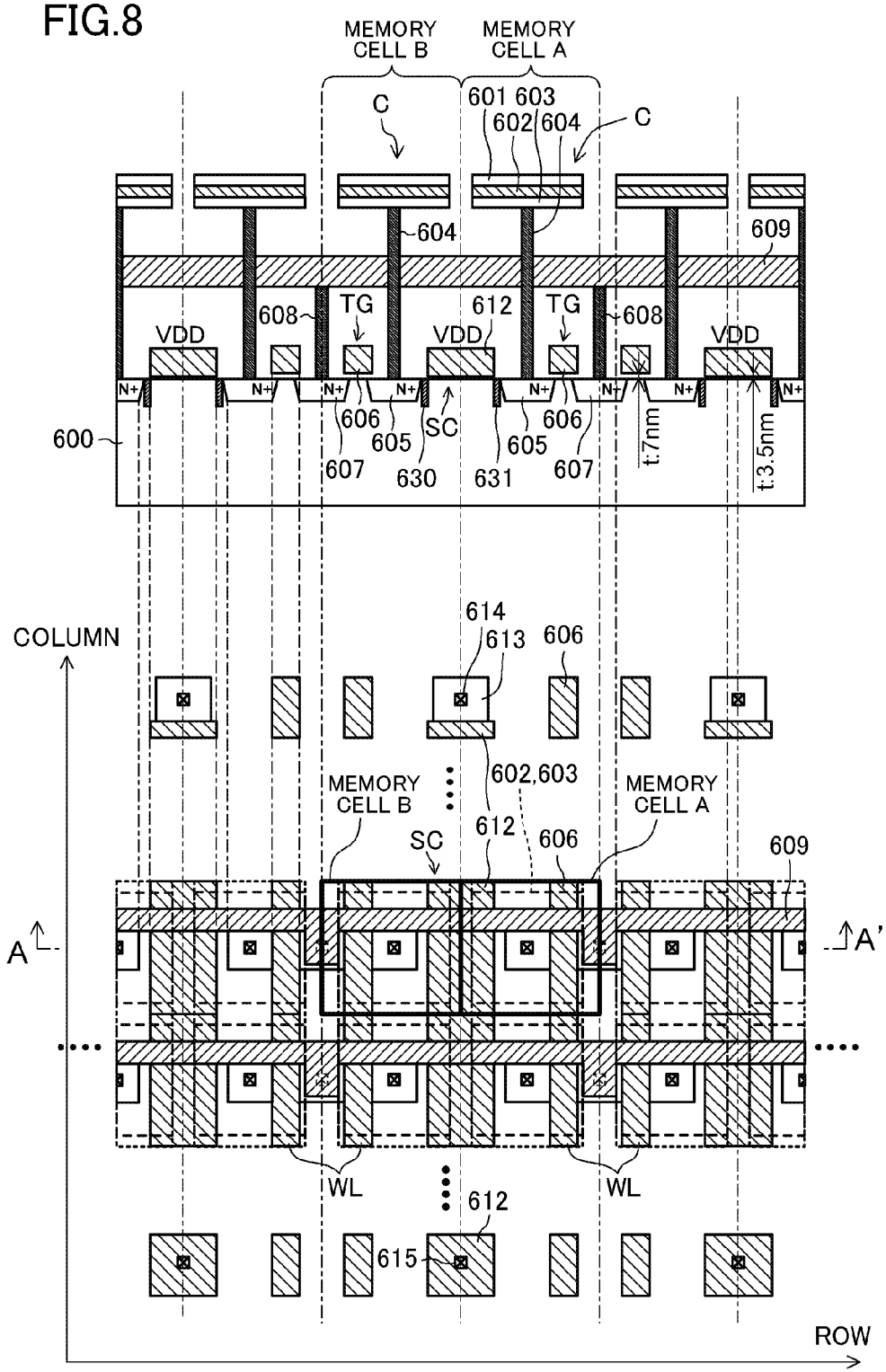
FIG. 8 shows a cross-sectional view and a plan view of a memory cell array of a semiconductor memory device according to a sixth embodiment of the present disclosure. The cross-sectional view illustrates a cross-section taken along the line A-A' of the plan view.

FIG. 8 shows a cross-sectional view and a plan view of a semiconductor memory device according to a sixth embodiment of the present disclosure having the features of claims 1, 4, 5, 6, and 7 of the present application. The cross-sectional view is taken along the line A-A' of the plan view. The plan view illustrates a part of the memory cell array 901. A configuration of a plurality of memory cells will be described with reference to a memory cell A of the cross-sectional view taken along the line A-A'.

In FIG. 8, 600 is a substrate. In a ferroelectric memory capacitive element C which is a first capacitive element, 601 is a plate interconnect (an upper electrode), 602 is a ferroelectric, 603 is a lower electrode, and 604 is a lower electrode contact connected to a doped region 605 of a transfer gate TG.

The transfer gate TG, which is a selective element, is comprised of a first NMOS transistor, 605 and 607 are doped regions of the transfer gate TG, and 606 is a gate electrode connected to a word line WL. Furthermore, 608 is a bit line contact, 609 is a bit line, and the doped region 607 and the bit line 609 are connected by the bit line contact 608.

A smoothing capacitor SC is comprised of a second NMOS transistor, and includes a gate electrode 612 and doped regions 613. The gate electrode 612 and the doped regions 613 form a MOS transistor capacitor. A feature of this embodiment is that the thickness of a gate oxide film of the MOS transistor capacitor is smaller than the thickness of a gate oxide film of the transfer gate TG. For example, in the transfer gate TG, a predetermined write voltage has to be applied to the lower electrode 603 of the ferroelectric memory capacitive element C. Therefore, when a write voltage equal to a power supply voltage is applied, a gate voltage of the transfer gate TG has to be equal to or higher than a voltage represented by (the power supply voltage+a threshold voltage of MOS). Thus, a breakdown voltage of the gate oxide film of the transfer gate TG has to be equal to or higher than the voltage represented by (the power supply voltage+the threshold voltage). However, the breakdown voltage of the smoothing capacitor SC may be a breakdown voltage relative to a target power supply source. Accordingly, when the smoothing capacitor SC is formed for the power supply voltage, the breakdown voltage of the smoothing capacitor SC may be ensured for the normal power supply voltage. Therefore, the thickness of the gate oxide film of the smoothing capacitor SC can be smaller than the thickness of the gate oxide film of the transfer gate TG. For example, when the thickness t of the gate oxide film of the transfer gate TG is set to be t=7 nm and the thickness t of the gate oxide film of the smoothing capacitor SC is set to be t=3.5 nm, the capacity value can be almost doubled.

Seventh Embodiment

Figure 9:
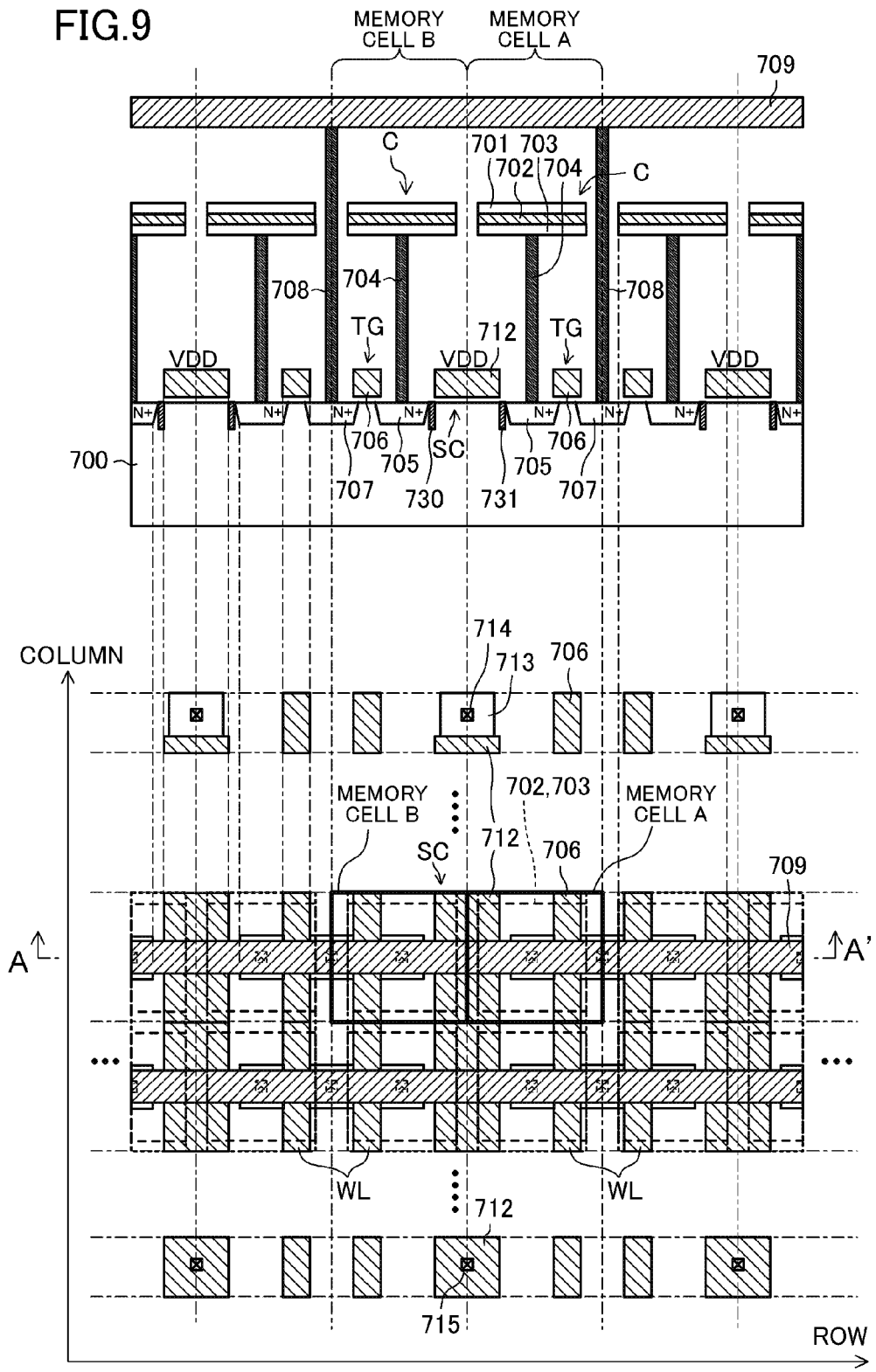
FIG. 9 shows a cross-sectional view and a plan view of a memory cell array of a semiconductor memory device according to a seventh embodiment of the present disclosure. The cross-sectional view illustrates a cross-section taken along the line A-A' of the plan view.

FIG. 9 shows a cross-sectional view and a plan view of a semiconductor memory device according to a seventh embodiment of the present disclosure having the features of claims 1, 4, 6, and 7 of the present application. The cross-sectional view illustrates a cross section taken along the line A-A' of the plan view. In this embodiment, a bit line is provided above a ferroelectric memory capacitive element C. The plan view illustrates a part of the memory cell array 901, including memory cells arranged in four rows and two columns. A configuration of plurality of memory cells will be described below with reference to a memory cell A of the cross-sectional view taken along the line A-A'.

In FIG. 9, 700 is a substrate. In a ferroelectric memory capacitive element C which is a first capacitive element, 701 is a plate interconnect (an upper electrode), 702 is a ferroelectric, and 703 is a lower electrode. The upper electrode 701, the ferroelectric 702, and the lower electrode 703 form a ferroelectric memory capacitive element C. Furthermore, 704 is a lower electrode contact connected to a doped region 705 of the transfer gate TG.

A transfer gate TG, which is a selective element, is comprised of a first NMOS transistor, 705 and 707 are doped regions of the transfer gate TG, and 706 is a gate electrode connected to a word line WL. Furthermore, 708 is a bit contact, 709 is a bit line, and the doped region 707 and the bit line 709 are connected by the bit line contact 708.

A smoothing capacitor SC is comprised of a second NMOS transistor, and includes a gate electrode 712 and doped regions 713. The gate electrode 712 and the doped regions 713 form a MOS transistor capacitor. Note that 730 and 731 are isolation regions. A contact 714 is provided at one end portion of the memory cell array 901 to couple the doped region 713 of the smoothing capacitor SC to ground potential, and a contact 715 couples the gate electrode 712 to power supply potential.

As described above, even in the configuration in which the bit line 709 is provided above the ferroelectric memory capacitive element C, the common gate electrode 712 connected to the power supply source is provided to overlap the memory cells A and B, and the doped regions 713 as a source and a drain are arranged in the row direction, so that the smoothing capacitor SC can be arranged in a region of the ferroelectric memory capacitive elements C.

Eighth Embodiment

Figure 10:
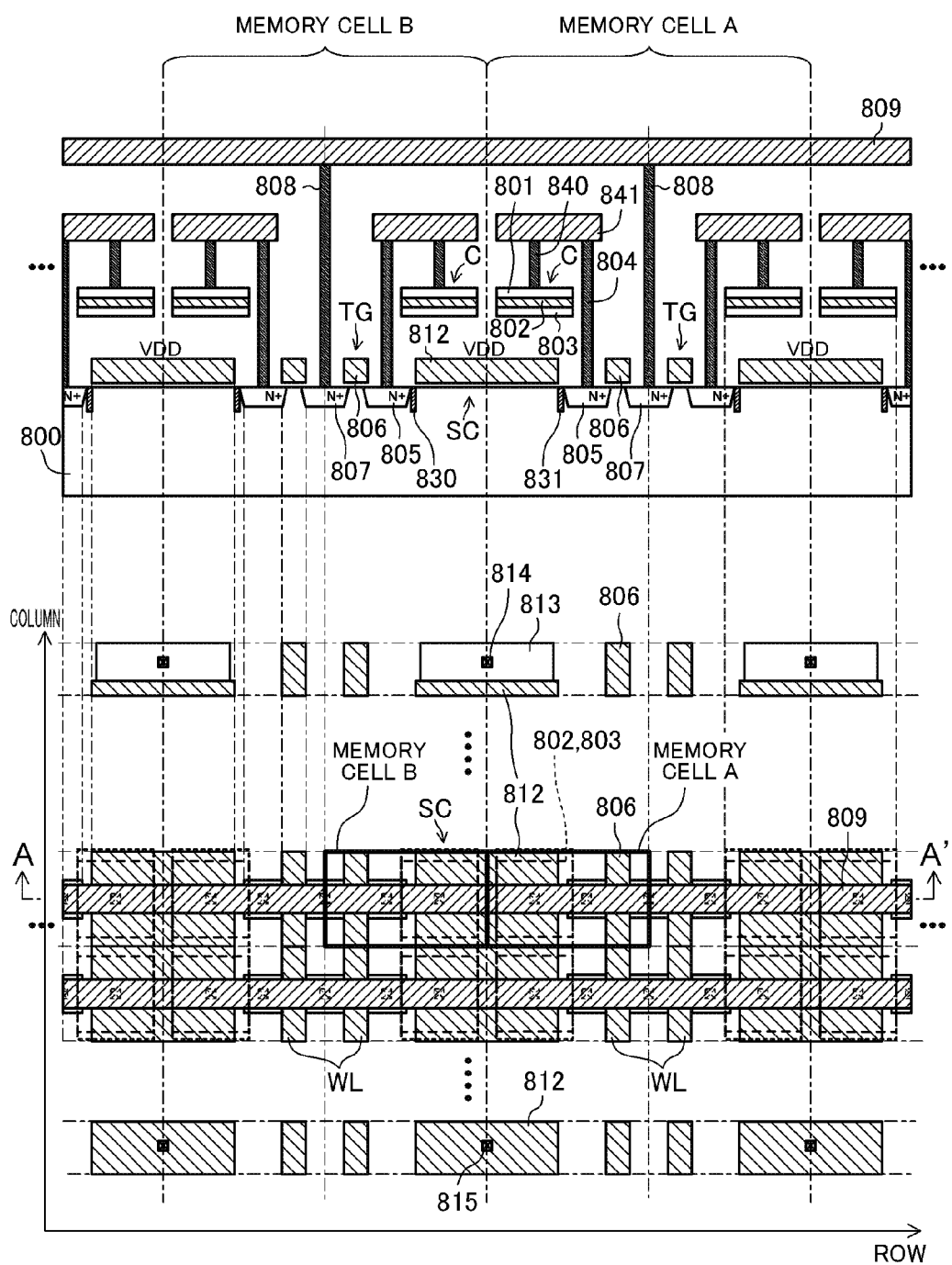
FIG. 10 shows a cross-sectional view and a plan view of a memory cell array of a semiconductor memory device according to an eighth embodiment of the present disclosure. The cross-sectional view illustrates a cross-section taken along the line A-A' of the plan view.

FIG. 10 shows a cross-sectional view and a plan view of a semiconductor memory device according to an eighth embodiment of the present disclosure having the features of claims 1, 4, 6, and 7 of the present application. The cross-sectional view illustrates a cross section taken along the line A-A' of the plan view. In this embodiment, a bit line is provided above a ferroelectric memory capacitive element C, and the ferroelectric memory capacitive element C is a planar type. The plan view illustrates a part of the memory cell array 901, including memory cells arranged in four rows and two columns. A configuration of plurality of memory cells will be described below with reference to a memory cell A of the cross-sectional view taken along the line A-A'.

In FIG. 10, 800 is a substrate. In a ferroelectric memory capacitive element C which is a first capacitive element, 801 is a plate interconnect (an upper electrode), 802 is a ferroelectric, and 803 is a lower electrode. The upper electrode 801, the ferroelectric 802, and the lower electrode 803 form a ferroelectric memory capacitive element C. Also, 840 is a plate interconnect (upper electrode) contact, and 841 is a first interconnect layer. Furthermore, 804 is a contact connected to a doped region 805 of a transfer gate TG.

The transfer gate TG is a comprised of a first NMOS transistor, 805 and 807 are doped regions of the transfer gate TG, and 806 is a gate electrode connected to a word lines WL. Furthermore, 808 is a bit line contact, 809 is a bit line, and the doped region 807 and the bit line 809 are connected by a bit line contact 808.

A smoothing capacitor SC is comprised of a second NMOS transistor, and includes a gate electrode 812 and doped regions 813. The gate electrode 812 and doped regions 813 form a MOS transistor capacitor. Note that 830 and 831 are isolation regions. A contact 814 is provided at an end portion of the memory cell array 901 to couple the doped region 813 of the smoothing capacitor SC to ground potential, and a contact 815 couples the gate electrode 812 of the smoothing capacitor SC to a power supply voltage.

As described above, even when the ferroelectric memory capacitive element C is arranged above the bit line 809, and the ferroelectric memory capacitive element C is a planar type, the common gate electrode 812 connected to a power supply source is arranged to overlap a memory cell A and a memory cell B, and the doped regions 813 as a source and a drain are arranged in the column direction, so that the smoothing capacitor SC can be arranged in a region of the ferroelectric memory capacitive elements C.

As described above, according to the present disclosure, smoothing capacitors which are necessary for stabilizing a power supply voltage of a circuit can be provided in a memory array section, and a chip area can be reduced. Therefore, the present disclosure is useful for a semiconductor memory using, for example, a ferroelectric, and a semiconductor memory device such as a DRAM, etc.

What is claimed is:

1. A semiconductor memory device, comprising:
a plurality of bit lines arranged in a column direction;
a plurality of word lines arranged in a row direction; and
a memory cell array including a plurality of memory cells which are arranged at intersections of the bit lines and the word lines, each memory cell including a selective element and a first capacitive element connected in series between an associated one of the bit lines and a plate interconnect, the selective element having a control terminal connected to an associated one of the word lines,
wherein in an underlying layer of the first capacitive element, a second capacitive element is provided to overlap two or more of the memory cells, and
the selective element is a first MOS transistor, and the second capacitive element is a second MOS transistor.

2. The semiconductor memory device of claim 1, wherein respective lengths of short sides and long sides of an electrode of the first capacitive element connected to the selective element are different from each other.

3. The semiconductor memory device of claim 1, further comprising:
a dummy memory cell array which is not used as a memory element and provided near the memory cell array,
wherein a bit line of the dummy memory cell array and a terminal of the second capacitive element are connected together.

4. The semiconductor memory device of claim 1, wherein a thickness of a gate oxide film of the first MOS transistor is different from a thickness of a gate oxide film of the second MOS transistor.

5. The semiconductor memory device of claim 1, wherein a direction in which a source and a drain of the first MOS transistor are arranged is different from a direction in which a source and a drain of the second MOS transistor are arranged.

6. The semiconductor memory device of claim 1, wherein the first and second MOS transistors are NMOS transistors.

7. The semiconductor memory device of claim 1, wherein the control terminal of the first MOS transistor is a gate electrode.

8. The semiconductor memory device of claim 1, wherein a voltage of a first terminal of the second capacitive element is a power supply voltage, and a voltage of a second terminal of the second capacitive element is ground potential.

9. The semiconductor memory device of claim 1, wherein a voltage of a first terminal of the second capacitive element is a power supply voltage for driving the word lines, and a voltage of a second terminal of the second capacitive element is ground potential.

10. The semiconductor memory device of claim 1, wherein a voltage of a first terminal of the second capacitive element is a power supply voltage of an internal power supply circuit provided in a peripheral circuit section, and a voltage of a second terminal of the second capacitive element is ground potential.

11. The semiconductor memory device of claim 1, wherein the first capacitive element is a ferroelectric capacitor.

12. The semiconductor memory device of claim 1, wherein the plurality of bit lines are arranged below the first capacitive elements.

13. The semiconductor memory device of claim 1, wherein the plurality of bit lines are arranged above the first capacitive elements.

14. The semiconductor memory device of claim 1, wherein the plurality of memory cells include a first memory cell and a second memory cell, the selective element of the first memory cell includes a first doped region to which the first capacitive element of the first memory cell is connected and a second doped region connected to an associated one of the bit lines, the selective element of the second memory cell includes a third doped region to which the first capacitive element of the second memory cell is connected, and a fourth doped region connected to an associated one of the bit lines, a gate electrode of the selective element of the first memory cell and a gate electrode of the selective element of the second memory cell are connected to different word lines, and the second capacitive element is arranged between the first doped region and the third doped region.

15. A semiconductor memory device, comprising:
a plurality of bit lines arranged in a column direction;
a plurality of word lines arranged in a row direction;
a memory cell array including a plurality of memory cells which are arranged at intersections of the bit lines and the word lines, each memory cell including a selective element and a first capacitive element connected in series between an associated one of the bit lines and a plate interconnect, the selective element having a control terminal connected to an associated one of the word lines; and
a dummy memory cell array which is not used as a memory element and provided near the memory cell array,
wherein in an underlying layer of the first capacitive element, a second capacitive element is provided to overlap two or more of the memory cells, and
a bit line of the dummy memory cell array and a terminal of the second capacitive element are connected together.

16. A semiconductor memory device, comprising:
a plurality of bit lines arranged in a column direction;
a plurality of word lines arranged in a row direction; and
a memory cell array including a plurality of memory cells which are arranged at intersections of the bit lines and the word lines, each memory cell including a selective element and a first capacitive element connected in series between an associated one of the bit lines and a plate interconnect, the selective element having a control terminal connected to an associated one of the word lines,
wherein in an underlying layer of the first capacitive element, a second capacitive element is provided to overlap two or more of the memory cells, and
a voltage of a first terminal of the second capacitive element is a power supply voltage, and a voltage of a second terminal of the second capacitive element is ground potential.

17. The semiconductor memory device of claim 16, wherein the power supply voltage is a power supply voltage for driving the word lines.

18. The semiconductor memory device of claim 16, wherein the power supply voltage is a power supply voltage of an internal power supply circuit provided in a peripheral circuit section.

19. The semiconductor memory device of claim 16, wherein respective lengths of short sides and long sides of an electrode of the first capacitive element connected to the selective element are different from each other.

20. The semiconductor memory device of claim 16, wherein the first capacitive element is a ferroelectric capacitor.

* * * * *